United States Patent [19]

Milberger et al.

[11] Patent Number: 5,032,799
[45] Date of Patent: Jul. 16, 1991

[54] MULTISTAGE CASCODE RADIO FREQUENCY AMPLIFIER

[75] Inventors: Walter E. Milberger, Panama City, Fla.; Charles S. Kerfoot, Pasadena, Md.; Daniel C. Buck, Hanover, Md.; Franklin B. Jones, Catonsville, Md.

[73] Assignee: Westinghouse Electric Corp., Pittsburgh, Pa.

[21] Appl. No.: 618,523

[22] Filed: Nov. 26, 1990

Related U.S. Application Data

[63] Continuation of Ser. No. 417,170, Oct. 4, 1989, abandoned.

[51] Int. Cl.[5] .......................... H03F 3/68; H03F 3/16
[52] U.S. Cl. ...................................... 330/311; 330/277; 330/296; 330/300
[58] Field of Search ............. 330/277, 296, 300, 302, 330/307, 310, 311

[56] References Cited

U.S. PATENT DOCUMENTS

| | | | |
|---|---|---|---|
| 3,999,139 | 12/1976 | Fennell | 330/311 X |
| 4,366,446 | 12/1982 | Henderson et al. | 330/311 X |
| 4,429,416 | 1/1984 | Page | 330/311 X |
| 4,523,057 | 6/1985 | Boeckmann | 330/296 X |
| 4,570,129 | 2/1986 | Milberger | 330/277 |
| 4,587,495 | 5/1986 | Osawa et al. | 330/300 X |
| 4,647,872 | 3/1987 | Johnson | 330/311 |

FOREIGN PATENT DOCUMENTS 2243297 6/1973 Fed. Rep. of Germany ...... 330/311

*Primary Examiner*—Steven Mottola
*Attorney, Agent, or Firm*—W. G. Sutcliff

[57] ABSTRACT

A cascode radio frequency amplifier in which a control amplifier stage is provided and any number of clone amplifier stages are connected in series (cascode) with the control amplifier. The cascode amplifiers provide equal voltage and power since each of the clone stages provides unity gain. The device can operate from low frequencies to high frequencies.

11 Claims, 4 Drawing Sheets

MULTISTAGE CASCODE RADIO FREQUENCY AMPLIFIER

This application is a continuation of Ser. No. 07/417,170 filed Oct. 4, 1989, now abandoned.

BACKGROUND OF THE INVENTION

(1) Field of the Invention

The present invention is directed to a cascode radio frequency amplifier. The cascode amplifier of the present invention provides equal voltage and power sharing of cascode amplifier stages. Each amplifier stage provides unity gain and is a clone of a first control amplifier stage. The device operates over a frequency range from the low frequency band to the microwave band.

(2) Description of Related Art

Traditional solid-state microwave amplifiers employ a system of amplifiers connected in cascade. An example of a typical cascade power amplifier chain will include, for example, five amplifiers, each of which has a power gain of 6 dB, a power splitter having a ratio of 1:4, and 3 dB couplers. The power splitter is connected between the first amplifier and four of the other amplifiers. The 3 dB couplers is connected to the output of the four serial amplifiers. At an input power of 24 dBm (250 milliwatts) the first amplifier would provide 30 dBm to the input of the power splitter. The output of the power splitter would then provide 24 dBm to each of the four amplifiers connected thereto. The 30 dBm (1 watt) output from each of the amplifiers is then supplied to the 3 dB couplers. Two of the outputs from two of the amplifiers are connected to a first coupler and two of the outputs from two of the remaining amplifiers are connected to a second coupler. The output from the couplers are combined in an output coupler which provides a final output of 36 dBm (4 watts). The output power from each of the circuits, however, does not take into account matching, combining, and power splitting losses which would be on the order of one decibel. The efficiency of each amplifier is between 40 and 50% and the total efficiency of a cascade amplifier of this type would be approximately 45% which results from rectifier and series regulator losses. Each 1 watt amplifier stage, if the regulated drain D/C power supply efficiency is on the order of 70%, has an overall efficiency of 31.5%. The total input power required for a circuit including five 1 watt amplifier stages is 15.9 watts. This yields a total efficiency for a 4 watt radio frequency output power of 25%. Although cascode RF amplifiers have been tried, due to the complex biasing networks required for series operation of the transistors, they have not been successful beyond two stages. This is because each stage must be referenced to ground, and the more stages added, the more complicated the circuitry becomes. Therefore, radio frequency amplifiers have been limited to employing cascade amplifier chains in order to achieve power amplification.

SUMMARY OF THE INVENTION

It is an object of the present invention to provide a cascode radio frequency amplifier in which three or more stages can be stacked so that there is equal voltage and power sharing between all stages and low loss power combining.

Another object of the present invention is to provide a cascode radio frequency amplifier which has wide band operation to realize the full gain bandwidth of the active device and self-biasing so as to optimize performance of each cascode stage.

It is yet another object of the present invention to provide a cascode radio frequency amplifier in which impedance normalization of each stage is performed so that inner stage matching is obtained.

It is yet another object of the present invention to provide a cascode RF amplifier in which greater power gain than cascade amplifiers is obtained, the reliability of the circuit is increased due to the simplicity of the circuit, and there is an increase in overall efficiency due to a reduction in power loss.

It is still another object of the present invention to provide a cascode RF amplifier having linear operation over a wide frequency range and having automatic bias adjustments performed to compensate for gate threshold (pinch-off) shift over a full operational temperature range.

The above-mentioned objects of the present invention are achieved by providing a radio frequency cascode amplifier including an amplifier circuit connected in series, each amplifier circuit having unity gain and being clones of each other. The amplifier circuit includes a control amplifier and clone follower stages connected in series with the control amplifier. The clone follower stages each comprise a unity gain amplifier for providing a unity power gain. Each of the amplifier circuits comprises a transistor circuit and a bias circuit connected to the transistor circuit for providing an automatic bias to the transistor circuit. The bias circuit includes a first resistor connected to the transistor circuit, a second resistor connected in series with the first resistor and a capacitor connected in parallel with the second resistor.

In addition, the radio frequency cascode amplifier includes an input circuit. The input circuit includes a first capacitor for receiving an input signal and reducing the negative feedback effect of the reverse transfer capacitance of the control amplifier, an inductor connected to the first capacitor and a second capacitor connected in parallel with the inductor. An output circuit is provided which includes a load, a third capacitor connected to the load, a second inductor connected to the third capacitor, and a fourth capacitor connected between the inductor and ground.

The amplifier circuit can include field effect transistors, bipolar transistors, or a combination of field effect and bipolar transistors. Any number of amplifier circuits can be connected in series.

DESCRIPTION OF THE PREFERRED EMBODIMENTS

Figure 1:
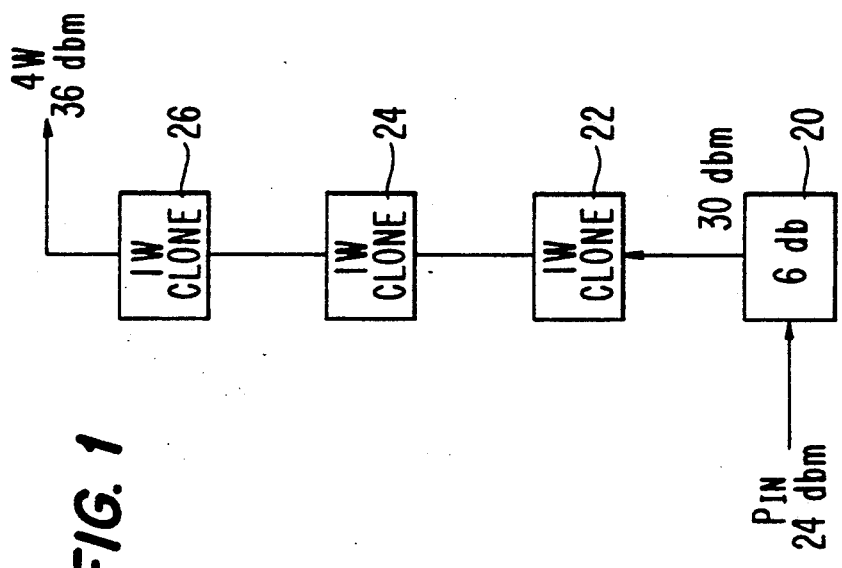
FIG. 1 is a block diagram of a cascode amplifier according to the present invention.

FIG. 1 is a block diagram of a cascode amplifier according to the present invention. A control amplifier stage 20 is provided which has a 6 dB gain. This amplifier eliminates the need for a preamplifier and a power splitter which are required in the prior art. The control amplifier stage 20 directly drives a first clone amplifier stage 22. The first clone amplifier stage 22 drives a second clone amplifier stage 24 and the second clone amplifier stage 24 drives a third clone amplifier stage 26. In this manner, the 3 dB combining couplers which are required in cascade amplifier art, are no longer needed.

In the cascode amplifier in FIG. 1, each amplifier stage drops one-quarter of the supply voltage by virtue of a bias network. When a 24 dBm input signal is applied to the control amplifier stage 20, it develops a 1 watt output which is fed to a load through clone amplifier stages 22, 24 and 26. Each clone amplifier stage contributes 1 watt to the radio frequency output which is combined to provide a final output power of 4 watts.

Figure 2:
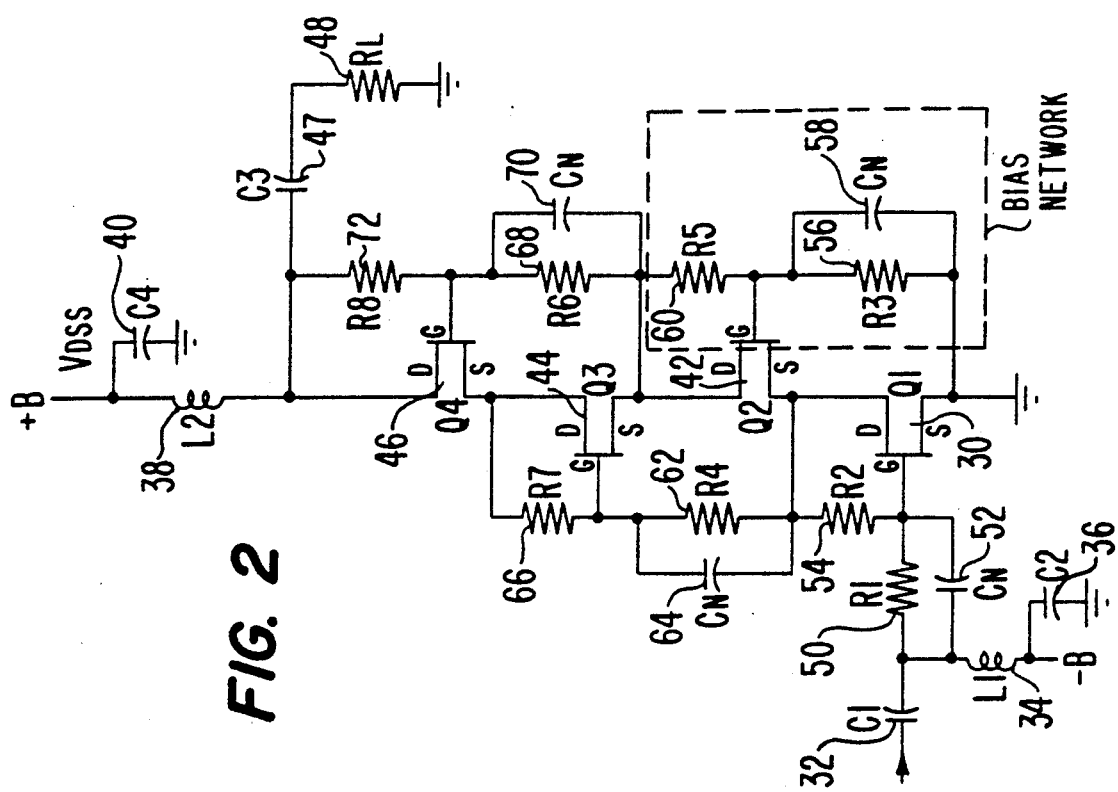
FIG. 2 is a circuit diagram of the cascode amplifier in FIG. 1.

FIG. 2 is a circuit diagram of the cascode amplifier in FIG. 1. In FIG. 2, a radio frequency signal is applied to a gate of a first transistor 30 by way of an input capacitor 32. An input stage is provided connected to the input capacitor 32 and includes a first inductor 34 connected to the input capacitor 32 and a first capacitor 36 connected between the first inductor 34 and ground. An output stage is provided which includes a load 48, an output capacitor 47, a second inductor 38 and a second capacitor 40 connected between the second inductor 38 and ground. The input and output stages provide radio frequency isolation from gate and drain bias supplies. Transistors 42, 44 and 46 are clone follower stage amplifiers in the first through third clone amplifier stages 22, 24 and 26, respectively.

The bias network for the control amplifier includes a first resistor 50 and a third capacitor 52 connected in parallel. A first end of the parallel connection is connected to the input capacitor 32 and the first inductor 34 and a second end of the parallel connection is connected to the gate of the first transistor 30. A second resistor 54 is connected to the second end of the parallel connection. The bias network for the first clone stage amplifier 24 includes a third resistor 56 connected in parallel with a fourth capacitor 58. A first end of the parallel connection is connected to the source of the first transistor 30 and a second end is connected to the gate of the second transistor 42 in the first clone amplifier stage 22. A fourth resistor 60 is connected to the second end of the parallel connection. The second clone amplifier stage 26 includes a fifth resistor 62 connected in parallel with a fifth capacitor 64. A first end of the parallel connection is connected to the source of the second transistor 42 in the first clone amplifier stage 24. A second end of the parallel connection is connected to the gate transistor 44 in the second clone amplifier stage 24. A sixth resistor 66 is connected to the second end of the parallel connection. The third clone amplifier stage 28 includes a seventh resistor 68 connected in parallel with a sixth capacitor 70. A first end of the parallel connection is connected to the source of the transistor 44 in the second clone amplifier stage 26 and the fourth resistor 60. A second end of the parallel connection is connected to the gate of the transistor 46 in the third clone amplifier stage 26. An eighth resistor 72 is connected to the second end of the parallel connection.

The capacitors 52, 58, 64 and 70 in the respective bias networks neutralize the capacitance of the device. The resistors 50, 56, 62 and 68 in the respective bias networks provide automatic biasing to each clone amplifier stage to obtain unity gain with minimal phase shift.

The first transistor 30 in the control amplifier stage 20 can be biased to effect Class A through Class C amplifier operation. For Class B operation, the gate bias supply voltage of the transistor 30 is set at one-fourth of the drain supply voltage (Vdss). The first resistor 50 and the second resistor 54 connected to the gate of the transistor 30 are equal. The drain to source voltage of the transistor 30 is then one-fourth of the supply voltage Vdss. Therefore the voltage across each clone amplifier stage will be equal to one-fourth of the supply voltage.

The first through third clone amplifier stages 22, 24 and 26 operate as unity gain amplifiers since the resistors of each clone amplifier stage at the gate of the transistors provide a phantom virtual ground. This configuration provides power amplification out to the gain bandwidth product limit of the transistor used. Furthermore, each of the clone stages provides a power equal to that of the control amplifier stage 20. If the control amplifier stage 20, for example, provides a 1 watt output, the composite output of the amplifier in FIG. 2 will be 4 watts.

Automatic biasing is established due to the control amplifier stage 20 and the first through third clone follower stage amplifiers (22, 24 and 26) which provide four unity gain feedback amplifiers. The positive Vdss supply voltage applied to the drain of the transistor 46 in the third clone follower stage 46 causes that stage to turn on by applying a positive voltage to the gate of the transistor 46 through an eighth resistor 72. Turn on of the transistor 46 causes the transistor 44 in the second clone amplifier stage 24 to turn on which causes the transistor 42 in the first clone amplifier stage 22 to turn on. Turn on of the transistor 42 in the first clone amplifier stage 22 applies a positive voltage to the gain of the first transistor 30 in the control amplifier stage 20 which is normally off by virtue of a minus gate bias voltage applied through the first resistor 50. If the values of the first resistor 50 and second resistor 54 are equal, the drain voltage of the first transistor 30 assumes a positive potential which is equal to the minus bias supply voltage when the gate pinch-off or threshold voltage of the first transistor 30 is exceeded.

After the first transistor 30 assumes an equilibrium state in which its drain voltage is equal but opposite to its gain reference bias voltage, the present invention becomes operational. In this state, the drain voltage of the first transistor 30 appears at the source of the transistor 42 in the first clone amplifier stage 22. This causes the gate of the transistor 42 in the first clone amplifier stage 22 to become more negative with respect to its source since its gate is referenced to the source of the preceding stage, i.e., the control amplifier stage 20 and the transistor 30, through the third resistor 56. When the third resistor 56 and the fourth resistor 58 are equal, the drain voltage of the transistor 42 in the first clone amplifier stage 22 increases until its drain to source voltage amplitude is equal to that of the control amplifier stage 22. At this time, the first clone amplifier stage 22 assumes a state of equilibrium. A similar bias bootstrap action occurs in the second and third clone amplifier stages 24 and 26, since their respective gates are referenced to the sources of the preceding stages. For Class B operation, all the stages share the drain supply voltage equally after the bootstrap bias action is completed. For high frequency transistors, this action is completed in nanoseconds.

It should be noted that all of the circuit elements employed in this system are conventional. The various characteristics of each device, e.g., the particular resistance values, capacitive values, etc., will vary in accordance with the type of transistors employed and the desired operation of the circuit. When the circuit is required to operate at microwave frequencies GaAs field effect transistors (FETs) should be employed. These can be custom built in accordance with the desired operating characteristics of the circuit, or can be conventional GaAs FETs.

The above-mentioned bootstrap negative feedback biasing technique not only provides automatic stable biasing, but also compensates for gate threshold or pinch-off bias voltage shift over a wide temperature range to prevent operational mode changes and possible thermal runaway. A similar benefit is realized when bipolar transistors are employed.

The present invention is essentially the same as a regular DC circuit when the capacitance to ground is neglected. For frequencies up to UHF, capacitance to ground is not a major problem, however, for UHF on up, the stray capacitance becomes an important design consideration. All of the circuit elements in the device are conventional.

Figure 3:
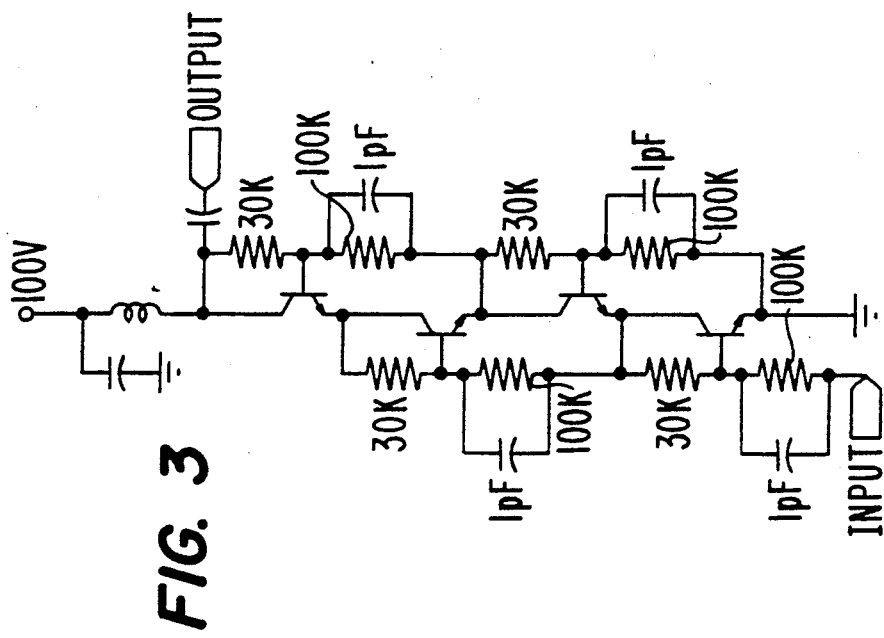
FIG. 3 is a preferred embodiment of the circuit in FIG. 2 for use at low frequencies.

FIG. 3 is a preferred embodiment of the circuit shown in FIG. 2. That is, FIG. 3 is a multistage cascode amplifier built and tested at low frequencies (i.e., 30 MHz). This embodiment employs bipolar transistors having values as shown in FIG. 3.

Figure 4:
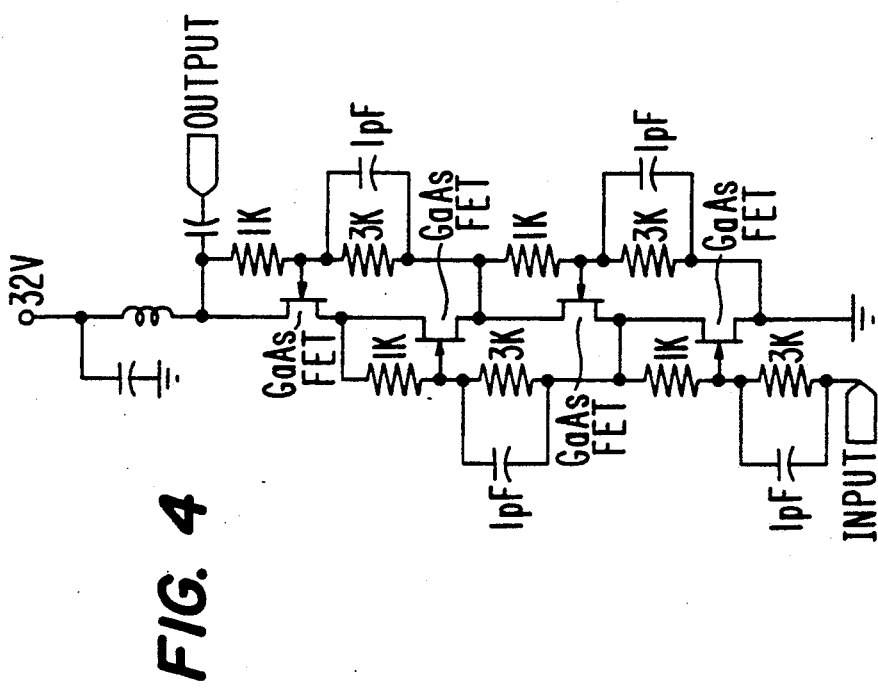
FIG. 4 is an alternate embodiment of FIG. 2 for use at 10 GHz or more.

FIG. 4 is an alternate embodiment of the circuit shown in FIG. 2. That is, FIG. 4 is a multistage cascode amplifier which can be employed for frequencies of 10 GHz or higher. This circuit is similar to FIGS. 2 and 3 except that it employs GaAs FETS, rather than bipolar transistors. The values of the resistors and capacitors used therein are adjusted accordingly.

Figure 5:
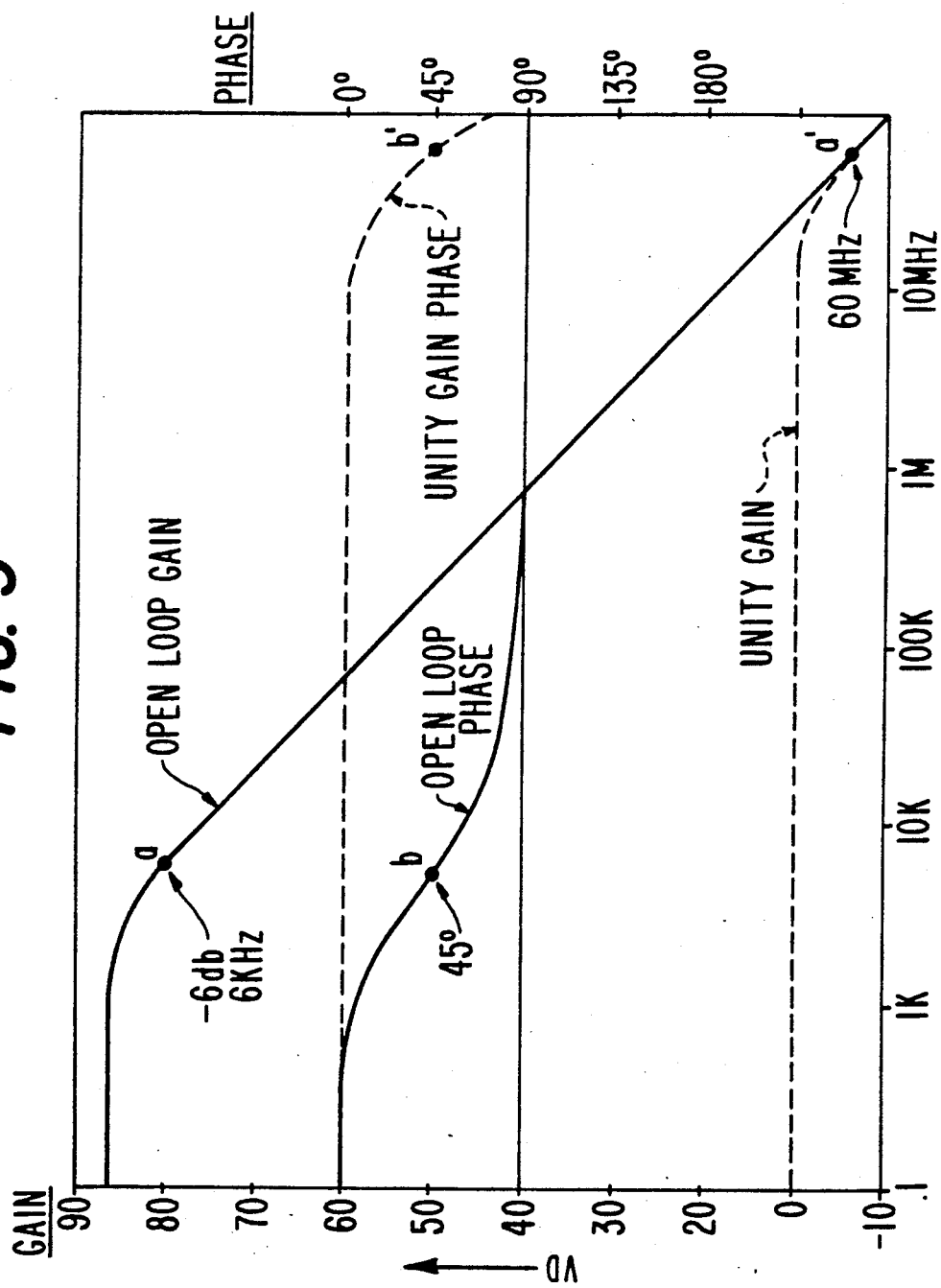
FIG. 5 is a graph of the operating characteristics of the circuit in FIG. 2.

With respect to FIG. 5, the radio frequency drive signal injected through the input capacitor 32 is superimposed on the DC bias voltage which is referenced to the first resistor 50 by way of the first inductor 34. When the first resistor 50 and the second resistor 54 are equal, the amplified output appearing on the drain of the first transistor 30 is equal and opposite to the input signal.

The benefits of maximizing the bandwidth of radio frequency amplifiers as unity gain power amplifiers is shown in FIG. 5 which depicts the open and closed loop (unity gain) gain-phase characteristics of an amplifier according to the present invention. The graph shown depicts a single pole amplifier which has an open loop gain of 80 dB at a bandwidth of 6 kHz (the solid line, point "a"). At the half power point, a phase lag between the input signal and the amplified output is 45° (point "b"). The corner frequency is important since power combining is only effective when the phase displacement between contributing amplifiers are within 45° of the half power point. When the phase displacement between contributing amplifiers tracks within 45° at gains less than the half power point, combining is still possible but at a lower efficiency. Power combining of open loop amplifiers is not always consistent because of environmental and long term variances.

If voltage gain is not required, the most efficient power combining over the maximum bandwidth would be achieved by using unity gain amplifiers. This is exactly what the present invention does. The present invention employs lower voltage gain while maintaining the same power gain to extend the bandwidth to the frequency limit of the unity gain device. This is shown in FIG. 5 where the dotted line depicts the unity gain (0 dB) phase characteristics. Compared to the open loop bandwidth of 6 kHz, the unity gain bandwidth is extended to 60 MHz. This implies that a transistor which is not of high quality can be made to operate as an exotic high frequency device.

In cascade amplifiers it is difficult to take advantage of this bandwidth benefit because the amplifiers require voltage gain. The present invention, however, has no such restriction since the clone amplifier stages operate at unity gain. Therefore, both maximum bandwidth and power gain is achieved by employing the present invention.

Figure 6:
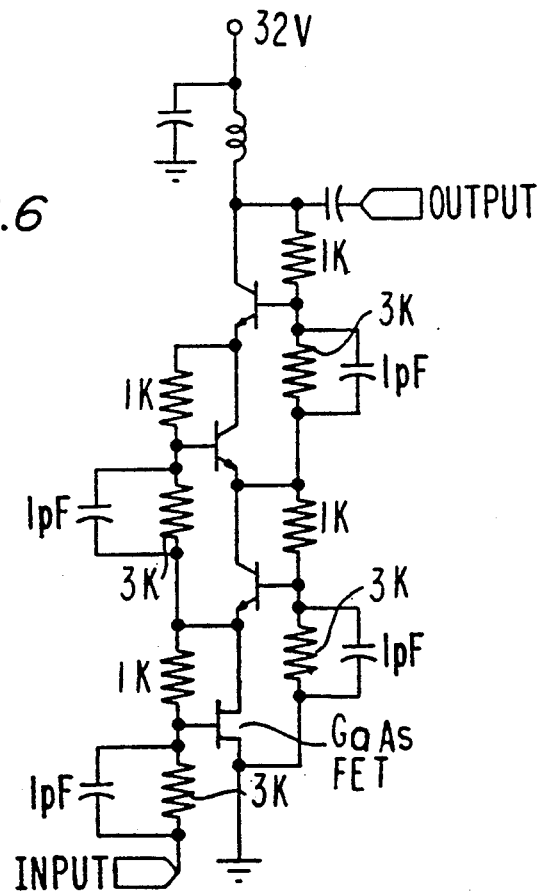
FIG. 6 is an alternate embodiment which illustrates the use of a field effect transistor control stage which drives a series of bipolar clone stages.

A variety of circuit configurations other than that shown in FIG. 2 are possible. The circuit in FIG. 2 has been demonstrated as a multiple stage amplifier using both field effect transistors and bipolar transistors. At the sacrifice of bandwidth, the control stage amplifier 20 can provide voltage gain if needed. One field effect transistor circuit configuration demonstrated provided a voltage gain of 60 dB in the first stage. Because of the automatic closed loop biasing technique employed in the present invention, the control stage can be a high frequency FET transistor which drives a series of bipolar clone stages. This configuration, illustrated in FIG. 6, allows for a high power gain using clone stages which do not have high quality transistors therein but replicate the high performance of the control stage.

Although there has been no reference to tuning out parasitics inherent in a cascode circuit, for frequencies up to 1 GHz these parasitics are not a severe problem if the clone stages have a bandwidth sufficient to permit in-phase power combining. At microwave frequencies, however, the parasitics db become a problem particularly with respect to the stray capacitance to ground. The best way to minimize the capacitance to ground is to minimize the area of the circuit components. This suggests that an integrated circuit be used for the entire amplifier.

The simplicity of the amplifier design of the invention makes the circuit very suitable for composite integration. Under the conditions that the reverse transfer capacitance of the transistors can be nullified by the capacitors in the bias networks and the transistor bandwidth is adequate to effect in-phase power combining, the only reactive element would be the drain to source output capacitance. This capacitance, referred to the output, would appear as the capacitance of an individual stage divided by the number of stages used. Likewise, the output impedance would be 1 divided by the transconductance of the common transistor employed times the number of stages. The integrated circuit would appear as a three terminal device whose characteristics, in virtually all aspects, would be superior to the open loop characteristics of the common low voltage prior art device. As such, the present invention can be used as a single high voltage microwave field effect transistor if the capacitance to ground can be controlled. That is, the circuit shown in FIG. 2, including a stack of four or more amplifiers, depending on the output desired, can be treated as an individual amplifier. Each of the individual amplifiers can then be stacked to form a system having a desired output. The output would be greater than that of prior art devices. The present invention shows great promise in that it could be used for power amplification from very low frequencies to microwave frequencies.

At low frequencies, 32 amplifiers were stacked without encountering any problems in the output. For low frequencies, FETs are more desirable than bipolar transistors because they have a higher voltage and require less drive. At frequencies from 1-5 GHz or more, bipolar transistors have an advantage over field effect transistors because bipolar transistors are not exact frequency transistors, are much less expensive and have a higher power than GaAs FETs. At higher frequencies, bipolar transistors do not work at all and GaAs FETs are the only choice available.

At low frequencies, most prior art low frequency power amplifiers employ parallel bipolar transistors directly rather than combining the transistors through hybrid power couplers. One of the most efficient parallel techniques employs binary differential emitter transformers to normalize the gains of parallel stages. A similar but less effective parallel combiner equalizer can be implemented by using a mesh emitter transformer when more than two stages are used. Such gain equalizers have proven very effective at the sacrifice of frequency response resulting from the emitter transformer networks. Employing the amplifier of the present invention completely negates the need for gain equalization networks while providing a decade or more in amplifier frequency response.

It appears very possible that new cascode bipolar transistor amplifier designs can be configured to provide a direct replacement for existing AM and FM broadcast transmitters which now use vacuum tubes, thus employing the existing power supply. In addition, such an amplifier would have superior linearity over an extensive dynamic range due to the inherent negative feedback characteristics of the amplifier of the present invention.

The above-mentioned features of the present invention provide the advantages of equal voltage and power sharing between all stages, low loss power combining, wide band operation that realizes the full gain bandwidth of the product (Ft) of the active device used, self-biasing to optimize performance of each cascode stage, and impedance normalization of each stage to ease inner stage matching. In addition, greater power gain than cascade amplifiers is obtained. The circuit of the present invention has a simple construction and increased reliability and efficiency. The production of the amplifier according to the present invention has lower manufacturing cost and higher operational voltage to increase the overall efficiency. Automatic bias adjustment is provided to compensate for gate threshold (pinch-off) shift over a full operational temperature range, and linear operation over a wide frequency range.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be resorted to as falling within the scope of the invention in the appended claims and their equivalents.

What is claimed is:

1. A radio frequency cascode amplifier comprising: amplifier means connected in series, each amplifier means having a unity gain;
wherein said amplifier means comprises a control amplifier and clone follower means connected in series with said control amplifier;
wherein each of said control amplifier means and said clone follower means comprises; transistor means, and bias circuit means connected to said transistor means for providing an automatic bias to said transistor means,
wherein each of said bias circuit means comprises:
a first resistor operatively connected to said transistor means;
a capacitor operatively connected in parallel with said first resistor; and
a second resistor operatively connected to the connection between said first resistor and said capacitor and to said transistor means.

2. A radio frequency cascode amplifier according to claim 1, further comprising:
input means, including:
a second capacitor, operatively connected to said control amplifier, for receiving an input signal and reducing a negative feedback effect of a reverse transfer capacitance of said control amplifier;
a first inductor operatively connected to said second capacitor; and
a third capacitor operatively connected between said inductor and ground;
load means; and
output means operatively connected to said load means, including:
a fourth capacitor operatively connected to said load means;
a second inductor operatively connected to said third capacitor; and
a fifth capacitor operatively connected between said second inductor and ground.

3. A radio frequency cascode amplifier, comprising:
a control amplifier;
clone follower means, operatively connected in series with said control amplifier, said clone follower means including n-number of clone follower stages, n being an integer greater than or equal to 1 and each providing a unity power gain, each of said control amplifier and said clone follower means including:
transistor means; and
bias circuit means, operatively connected to said transistor means, for providing an automatic bias to said transistor means, said bias circuit including:
a first resistor operatively connected to said transistor means;
a first capacitor operatively connected in parallel with said first resistor; and
a second resistor operatively connected to the connection between said first resistor and said first capacitor and to said transistor means;
input means operatively connected to said control amplifier, including:
a second capacitor, operatively connected to said control amplifier, for receiving an input signal and reducing a negative feedback effect of a reverse transfer capacitance of said control amplifier;

a first inductor operatively connected to said second capacitor; and
a third capacitor operatively connected between said inductor and ground;
load means; and
output means operatively connected to said load means, including:
a fourth capacitor operatively connected to said load means;
a second inductor operatively connected to said fourth capacitor; and
a fifth capacitor operatively connected between said second inductor and ground.

4. A radio frequency cascode amplifier according to claim 3, wherein said transistor means comprise GaAs field effect transistors.

5. A radio frequency cascode amplifier according to claim 3, wherein said transistor means comprise bipolar transistors.

6. A radio frequency cascode amplifier according to claim 3, wherein said control amplifier comprises a field effect transistor and said clone follower means comprise bipolar transistors.

7. A radio frequency cascode amplifier, comprising:
a control amplifier;
n-number of clone follower amplifiers operatively connected in series with said control amplifier, n being an integer greater than or equal to 1;
said control amplifier and each said clone follower amplifier comprising a transistor and a bias circuit;
each said bias circuit comprising a biasing means for applying a phantom virtual ground to said transistor, said biasing means operable to divide a supply voltage equally across said transistors.

8. A radio frequency cascode amplifier as in claim 7, wherein said biasing means comprises:
a first resistor operatively connected to said transistor;
a capacitor operatively connected in parallel with said first resistor; and
a second resistor operatively connected to the connection between said first resistor and said capacitor and to said transistor.

9. A radio frequency cascode amplifier as in claim 7, wherein said transistors comprise GaAs field effect transistors, and said cascode amplifier is operable at a frequency of 10 GHz or higher.

10. A radio frequency cascode amplifier as in claim 7, wherein said transistors comprise bipolar transistors, and said cascode amplifier is operable at frequencies from 1 to 5 GHz.

11. A radio frequency cascode amplifier as in claim 7, wherein said cascode amplifier is formed as an integrated circuit.

* * * * *